(12) United States Patent
Shih et al.

(10) Patent No.: US 12,062,151 B2
(45) Date of Patent: Aug. 13, 2024

(54) IMAGE-GUIDED ADJUSTMENT TO SUPER-RESOLUTION OPERATIONS

(71) Applicant: MediaTek Inc., Hsinchu (TW)

(72) Inventors: Ming-En Shih, Hsinchu (TW); Ping-Yuan Tsai, Hsinchu (TW); Yu-Cheng Tseng, Hsinchu (TW); Kuo-Chen Huang, Hsinchu (TW); Kuo-Chiang Lo, Hsinchu (TW); Hsin-Min Peng, Hsinchu (TW); Chun Hsien Wu, Hsinchu (TW); Pei-Kuei Tsung, Hsinchu (TW); Tung-Chien Chen, Hsinchu (TW); Yao-Sheng Wang, Hsinchu (TW); Cheng Lung Jen, Hsinchu (TW); Chih-Wei Chen, Hsinchu (TW); Chih-Wen Goo, Hsinchu (TW); Yu-Sheng Lin, Hsinchu (TW); Tsu Jui Hsu, Hsinchu (TW)

(73) Assignee: MediaTek Inc., Hsinchu (TW)

(*) Notice: Subject to any disclaimer, the term of this patent is extended or adjusted under 35 U.S.C. 154(b) by 45 days.

(21) Appl. No.: 17/118,162

(22) Filed: Dec. 10, 2020

(65) Prior Publication Data
US 2021/0287338 A1    Sep. 16, 2021

Related U.S. Application Data

(60) Provisional application No. 62/987,962, filed on Mar. 11, 2020.

(51) Int. Cl.
G06T 3/4053    (2024.01)
G06F 13/00    (2006.01)
(Continued)

(52) U.S. Cl.
CPC ............ G06T 3/4053 (2013.01); G06F 13/00 (2013.01); G06N 3/04 (2013.01); G06N 3/08 (2013.01);
(Continued)

(58) Field of Classification Search
None
See application file for complete search history.

(56) References Cited

U.S. PATENT DOCUMENTS

2018/0293706 A1*  10/2018  Viswanathan ........ G06T 3/4046
2018/0300855 A1   10/2018  Tang
(Continued)

FOREIGN PATENT DOCUMENTS

WO    WO-2019152499 A1 *  8/2019    ........... H04N 17/002

OTHER PUBLICATIONS

USPTO Office Action U.S. Appl. No. 17/196,957 mailed Nov. 17, 2022.

*Primary Examiner* — Aaron M Richer
(74) *Attorney, Agent, or Firm* — Tong J. Lee

(57) ABSTRACT

An image processing circuit performs super-resolution (SR) operations. The image processing circuit includes memory to store multiple parameter sets of multiple artificial intelligence (AI) models. The image processing circuit further includes an image guidance module, a parameter decision module, and an SR engine. The image guidance module operates to detect a representative feature in an image sequence including a current frame and past frames within a time window. The parameter decision module operates to adjust parameters of one or more AI models based on a measurement of the representative feature. The SR engine operates to process the current frame using the one or more AI models with the adjusted parameters to thereby generate a high-resolution image for display.

18 Claims, 6 Drawing Sheets

(51) Int. Cl.
    *G06N 3/04*         (2023.01)
    *G06N 3/08*         (2023.01)
    *G06T 3/4046*     (2024.01)
    *G06T 5/70*         (2024.01)
    *G06T 7/00*         (2017.01)
    *G09G 5/391*      (2006.01)
    *H01L 21/033*     (2006.01)
    *H04N 9/31*         (2006.01)

(52) U.S. Cl.
    CPC .............. *G06T 3/4046* (2013.01); *G06T 5/70* (2024.01); *G06T 7/0002* (2013.01); *G09G 5/391* (2013.01); *H01L 21/0338* (2013.01); *H04N 9/3188* (2013.01); *G06T 2207/20081* (2013.01); *G06T 2207/20084* (2013.01); *G06T 2207/30168* (2013.01)

(56) References Cited

U.S. PATENT DOCUMENTS

| | | | |
|---|---|---|---|
| 2018/0315155 A1 | 11/2018 | Park | |
| 2019/0251402 A1* | 8/2019 | Godwin, IV | G06N 3/088 |
| 2020/0104978 A1 | 4/2020 | Kalchbrenner | |
| 2020/0134425 A1* | 4/2020 | Chen | G06N 3/08 |
| 2020/0211159 A1* | 7/2020 | Migukin | G06T 3/0012 |
| 2020/0327675 A1* | 10/2020 | Lin | G06T 7/13 |
| 2020/0372632 A1* | 11/2020 | Chauhan | A61B 3/0025 |
| 2021/0097646 A1* | 4/2021 | Choi | G06T 5/50 |
| 2021/0264567 A1 | 8/2021 | Kim | |
| 2021/0272247 A1* | 9/2021 | Ryan | G06T 5/10 |
| 2022/0058803 A1* | 2/2022 | Bhattacharya | G06T 5/50 |

\* cited by examiner

New Parameters (weighted sum of N parameter sets)

New Parameters (a weighted parameter set)

New Parameters
(parameter sets and corresponding non-zero weights)

IMAGE-GUIDED ADJUSTMENT TO SUPER-RESOLUTION OPERATIONS

CROSS-REFERENCE TO RELATED APPLICATIONS

This application claims the benefit of U.S. Provisional Application No. 62/987,962 filed on Mar. 11, 2020, the entirety of which is incorporated by reference herein.

TECHNICAL FIELD

Embodiments of the invention relate to an edge device with image processing capability for performing super-resolution operations.

BACKGROUND

Modern image display devices typically enhance the images before they are displayed. Some devices can perform super-resolution with image enhancement. Super-resolution refers to the task of up-scaling a low resolution (LR) image to a higher resolution image, referred to as a super-resolution (SR) image; e.g., from an input image of (720×480) pixels to an output image of (3840×2160) pixels. Super-resolution operations can cause degraded image quality with respect to the amount of blurring, noise, distortion, color condition, sharpness, contrast, etc.

A typical edge device, such as a television or a smartphone, has limited computing power due to strict requirements on power consumption and thermal performance. Thus, image enhancement operations on an edge device are typically based on algorithms and parameters pre-configured by the device manufacturer. There is limited flexibility in adjusting the pre-configuration once the device is in use by a consumer. The limited flexibility can adversely affect output image quality when input images contain diverse contents and quality. Thus, there is a need for improving image enhancement operations to minimize the impact on the output image quality.

SUMMARY

In one embodiment, an image processing circuit is provided for performing super-resolution (SR) operations. The image processing circuit comprises a memory to store a plurality of parameter sets of a plurality of artificial intelligence (AI) models; an image guidance module to detect a representative feature in an image sequence including a current frame and past frames within a time window; a parameter decision module to adjust parameters of one or more AI models based on a measurement of the representative feature; and an SR engine to process the current frame using the one or more AI models with the adjusted parameters to thereby generate a high-resolution image for display.

In another embodiment, a method is provided for performing SR operations. The method comprises: detecting a representative feature in an image sequence including a current frame and past frames within a time window; adjusting parameters of one or more AI models based on a measurement of the representative feature; and processing the current frame using the one or more AI models with the adjusted parameters to thereby generate a high-resolution image for display.

Other aspects and features will become apparent to those ordinarily skilled in the art upon review of the following description of specific embodiments in conjunction with the accompanying figures.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

DETAILED DESCRIPTION

Figure 1:
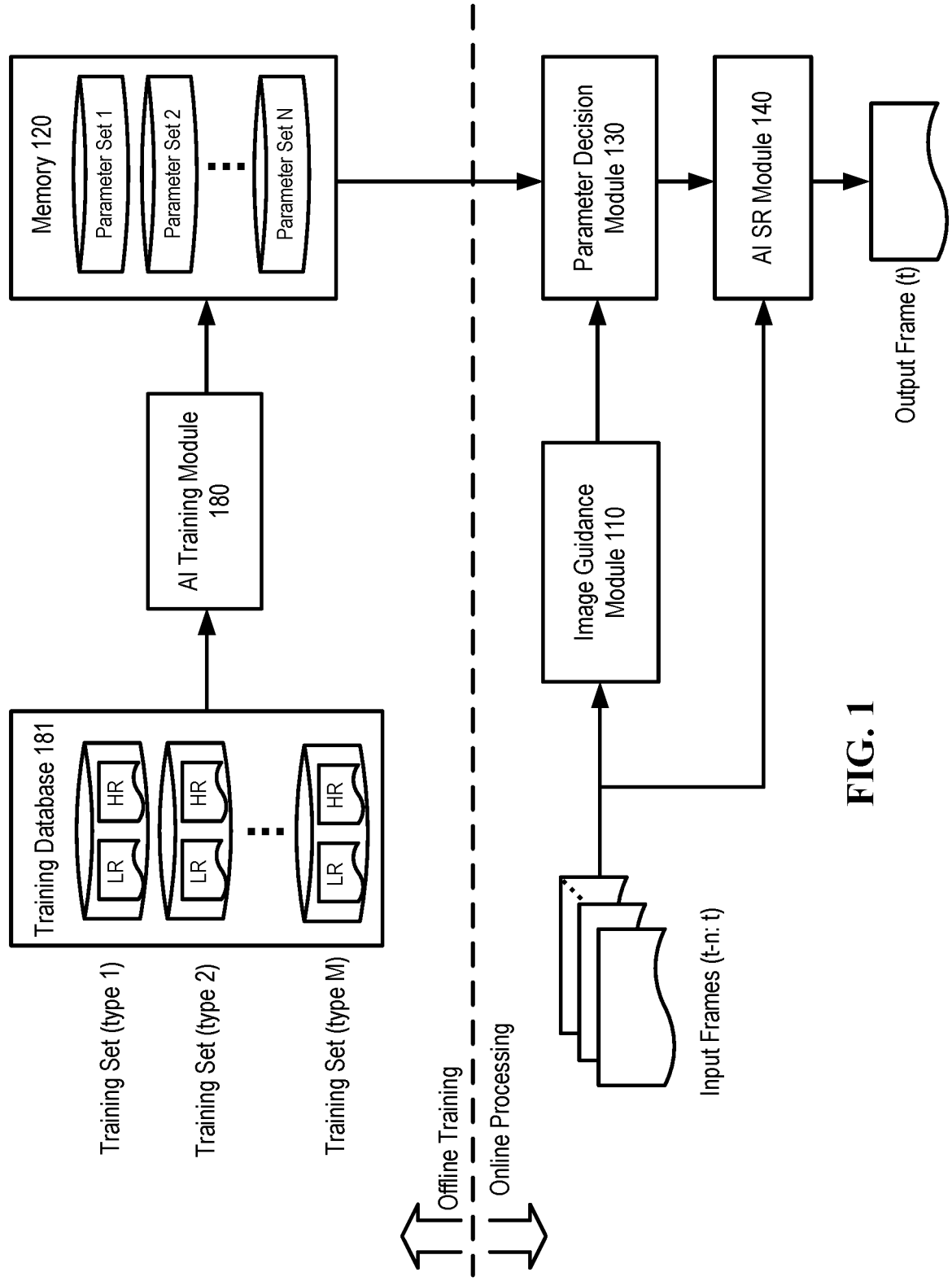
FIG. 1 is a block diagram illustrating adjustable super-resolution (SR) operations according to one embodiment.

In the following description, numerous specific details are set forth. However, it is understood that embodiments of the invention may be practiced without these specific details. In other instances, well-known circuits, structures, and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Embodiments of the invention provide an image processing circuit that can automatically adapt its operations to input image contents and quality. The image processing circuit includes a super-resolution (SR) engine that operates on low resolution (LR) input frames using AI models with dynamically adjustable parameters, and outputs SR frames with a required high resolution. The SR engine can remove artifacts in the input images. The parameters of the AI models are pre-trained and stored in the memory or registers of the image processing circuit. The pre-training may be performed with a training set including LR images and corresponding high-resolution (HR) images. The parameters are adjustable during runtime based on a representative feature detected in the input images. The adjustability of these parameters allows the SR engine to accommodate diverse input image contents and quality and to produce output images with enhanced quality.

The terms "LR" and "HR" are relative to each other; that is, an LR image has fewer pixels than an HR image for the same display size (e.g., N square inch). For example, An LR image may have (720×480) pixels and an HR image may have (3840×2160) pixels for the same display size. It is understood that an LR image and an HR image may have any number of pixels as long as the LR image has fewer pixels than the HR image for the same display size. The resolution of an SR image is higher than the resolution of an LR image, and maybe the same as, or lower than that of an HR image. In the following description, the terms "image" and "frame" are used interchangeably.

Generally, the pre-trained parameters are obtained from an offline training process using a limited number and types of training images. Thus, the pre-trained parameters generally do not cover input images of diverse contents and quality. The number of pre-trained parameters may be limited due to the limited memory capacity in the image processing circuit. A conventional SR circuit that only relies on the pre-trained parameters may be unable to handle different types of input images with different levels of image quality. As a result, a conventional SR circuit may be unable to remove artifacts that are present in the input images.

According to embodiments to be described herein, the SR engine uses one or more AI models in performing SR operations. Each AI model is characterized, or defined, by a set of AI operations and pre-trained parameters associated with the AI operations. In one embodiment, two or more pre-trained parameter sets may be weighted and combined to form an adjusted parameter set for use by the SR engine. The weighting of the parameters may be based on a measurement of the representative feature detected in an input image sequence. In one embodiment, the input image sequence may include a pre-determined or configurable number of frames in a video. The input image sequence may include a current frame and past frames in a time window, such as frame (t-n) to frame (t), where t is a time unit and n is a positive integer. As the input image content and/or quality changes, the parameters of the AI models can be adjusted accordingly, without having to re-train the AI models. For an edge device with limited processing resources and storage capacity (e.g., a smart TV, a smartphone, an IoT device, etc.), the methodology described herein provides great flexibility in runtime with minimal computation overhead.

FIG. 1 is a block diagram illustrating adjustable super-resolution (SR) operations according to one embodiment. An AI training module 180 trains AI models with a collection of training sets in a training database 181. Each training set contains LR images and their corresponding HR images. The training database 181 includes training sets of multiple (e.g., N) different training set types. A training set type may indicate a scene type, a degradation type, a color condition, a compression type, resolution, or another indicator of image content or quality. Additionally, a training set type may also indicate a level, an index, a score, or a measurement of a scene type, a degradation type, a color condition, a compression type, resolution, or another indicator of image content or quality. The output of the AI training module 180 is a collection of parameter sets; e.g., N parameter sets, where N may be any positive integer greater than one. Each parameter set contains parameters of an AI model for SR operations. Examples of the AI models include, but are not limited to, convolutional neural networks (CNNs), machine learning networks, deep learning networks, etc. Each parameter set may be labeled with the training set type for which it is trained; e.g., a parameter set P1 may be labeled as having a computer-generated (CG) scene when it is generated from a corresponding training set that contains LR and HR images of a CG scene.

In one embodiment, the training is performed in an offline training phase. In one embodiment, the offline training may be performed by a server, a cloud computing system, a computer, or another computing platform. The N parameter sets may be stored in or downloaded to a memory 120 of an edge device that performs SR operations. The memory 120 may include one or more of volatile and/or non-volatile random access memory (RAM) devices, read-only memory (ROM) devices, or any combination of the above.

Examples of an edge device, also referred to as a device, may include: a television, a smartphone, a computing device, a network-connected device, a gaming device, an entertainment device, an Internet-of-things (IoT) device, or any device capable of processing and displaying images and/or videos.

An online processing phase begins when the device receives a sequence of input frames via an input port. The input frames are LR images. The sequence of input frames includes a current frame (e.g., frame (t)) and past frames in a time window; e.g., frames (t-n) to frame (t), where t is a time unit and n is a configurable positive integer. The time window may be a continuously-sliding time window such that the parameters may be adjusted for every input frame. Alternatively, the time window may be applied to an input stream every n frames, periodically at a configurable period, or based on a detected event.

The online processing phase is performed on the device. During the online processing phase, an image guidance module 110 detects and/or measures a representative feature from the contents and/or quality in the input frame sequence within the time window. In one embodiment, the image guidance module 110 may compute a linear combination or a statistical combination of the input frames to obtain information about the frames including image contents, image quality, etc. Thus, any changes in image contents, image quality, and other image indices, types, scores, levels in the time window can be detected and measured. The image guidance module 110 then performs detection and/or measurement of a representative feature on the input frames or a combination of the input frames. In one embodiment, the image guidance module 110 executes statistical operations and/or AI operations to detect and/or measure a representative feature. Examples of the AI operations include, but are not limited to, convolutional neural network (CNN) operations, machine learning operations, deep learning operations, etc.

In one embodiment, the representative feature detected and/or measured by the image guidance module 110 may include at least a classification of image contents, such as a scene type, and an indication of image quality, such as an image quality index. Other representative features may include, but are not limited to, a pre-defined scene type (e.g., a CG image or a real image, a street scene or a sky scene, etc.), an image quality index, a degradation type, a degradation level, a color condition, image resolution, a noise level, a noise type, a video compression parameter, a coding artifacts level, color saturation, sharpness, contrast, etc.

The detected representative feature is received as input by a parameter decision module 130. In one embodiment, the parameter decision module 130 identifies one or more parameter sets in the memory 120 based on the representative feature. For example, the representative feature may be an image quality measurement, which is an indication of image quality such as an image quality index, a degradation type, a degradation level, a color condition, image resolution, a noise level, a noise type, a video compression parameter, a coding artifacts level, color saturation, sharpness, contrast, etc. When the representative feature is image quality index q, the parameter decision module 130 selects from the memory 120 a parameter set that is pre-trained with images of an image quality index equal to q or near q (i.e., within a predetermined threshold of q). If the memory 120 has two parameter sets pre-trained with images of image quality indices q1 and q2, where q1<q<q2, the parameter decision module 130 may output a weighted combination of these two parameters sets as the adjusted parameters. When the representative feature includes an image quality measurement and a classification of image contents (e.g., image quality index q for a CG scene), a pre-trained parameter set P1 may be identified as having a CG scene and another pre-trained parameter set P2 may be identified as having an image quality index q. Then the parameter decision module 130 generates adjusted parameters as output, by adjusting the parameters from the sets P1 and P2 based on a measurement (e.g., image quality index q in a CG scene) of the representative feature. The adjusted parameters can be used as the new parameters of one or more AI models for SR operations. In some embodiments, a weighted combination of more than two parameter sets may be computed and used as the new parameters for SR operations.

During the online processing phase, an SR engine 140 in the device receives the adjusted parameters and a current frame (e.g., frame (t)) of low resolution. The SR engine 140 performs SR operations on the current frame using one or more AI models and the adjusted parameters generated by the parameter decision module 130. In some embodiments, the SR engine 140 can remove artifacts in a current frame using one or more AI models and the parameters that are adjusted based on a scene type and an image quality index measured from the input image sequence. In some embodiments, the SR engine 140 can remove artifacts in a current frame using one or more AI models and the parameters that are adjusted or selected based on the detected or measured representative feature in the input image sequence.

An example of the SR operations performed by the SR engine 140 is CNN operations. Other machine learning operations and deep learning operations may also be performed by the SR engine 140. The SR engine 140 generates an output frame of high resolution. The output frame may be sent to a display via an output port.

Figure 2:
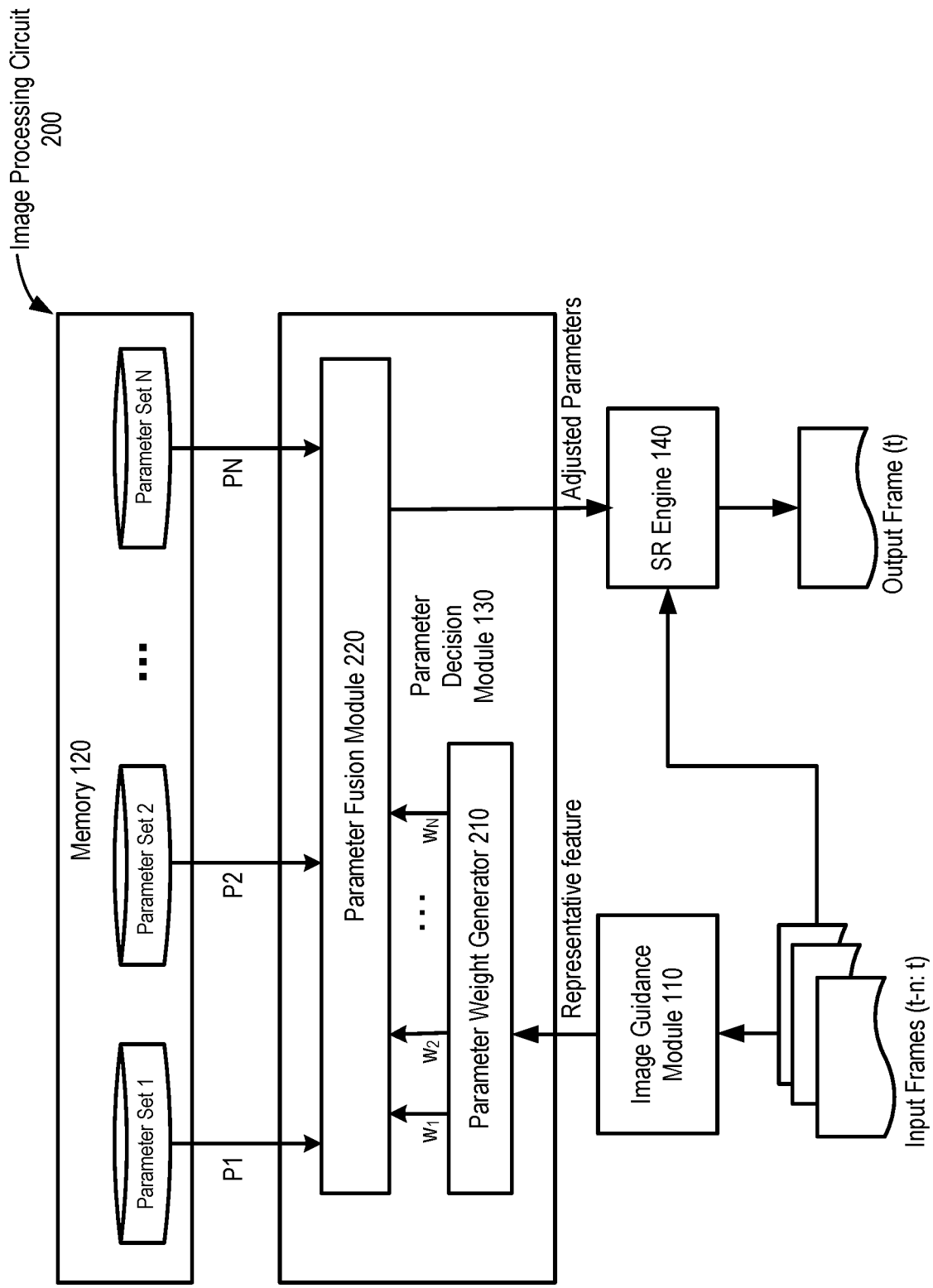
FIG. 2 is a block diagram illustrating an image processing circuit performing SR operations according to one embodiment.

FIG. 2 is a block diagram illustrating an image processing circuit 200 performing SR operations according to one embodiment. The image processing circuit 200 includes the image guidance module 110, the parameter decision module 130, the SR engine 140, and the memory 120 storing the parameter sets, as described in the example of FIG. 1. In some embodiments, the image processing circuit 200 may be an AI processor, a graphics processing unit (GPU), an Application Specific Integrated Circuit (ASIC), or another general-purpose or special-purpose processing circuit. In one embodiment, the image guidance module 110 and the SR module 140 are part of an AI processor operative to perform CNN computations for detecting the representative feature and processing a current frame. In one embodiment, the image processing circuit 200 may be implemented as a system-on-a-chip (SoC). In some embodiments, the image processing circuit 200 may be implemented in more than one chip in the same electronic device.

In the embodiment of FIG. 2, the parameter decision module 130 further includes a parameter weight generator 210 and a parameter fusion module 220. The parameter weight generator 210 receives a representative feature detected and/or measure by the image guidance module 110. In one example, the image guidance module 110 may output a representative feature with a measurement; e.g., noise level σ, blurring level γ, and JPEG compression level α, where σ, γ and α are numerical values. In another example, the image guidance module 110 may output a representative feature with a scene classification score of a first scene type and a second scene type. In yet another example, the image guidance module 110 may output a representative feature with an image condition measurement of brightness, saturation, and contrast. The parameter weight generator 210 generates weights for the representative feature based on the measurement.

The parameter decision module 130 further includes a parameter fusion module 220, which applies the weights to the parameter sets associated with the representative feature. In one embodiment, the parameter fusion module 220 computes a weighted sum using the weights. For example, the parameter weight generator 210 may generate weights $w_1$, $w_2$, $w_3$, ... $w_N$ for N different parameter sets, respectively, and the parameter fusion module 220 may compute a weighted sum of the N parameter sets to produce a new parameter set Pnew. For example, the parameter weight generator 210 may generate weight $w_1$ for noise level σ, and $w_2$ for blurring level γ. The parameter fusion module 220 may compute a weighted sum Pnew=($w_1$×Pi+$w_2$×Pj), wherein Pi is the parameter set for the noise level and Pj is the parameter set for the blurring. The new parameter set Pnew is used by the SR engine to one or more AI models for SR operations on a current frame.

Figure 3A:
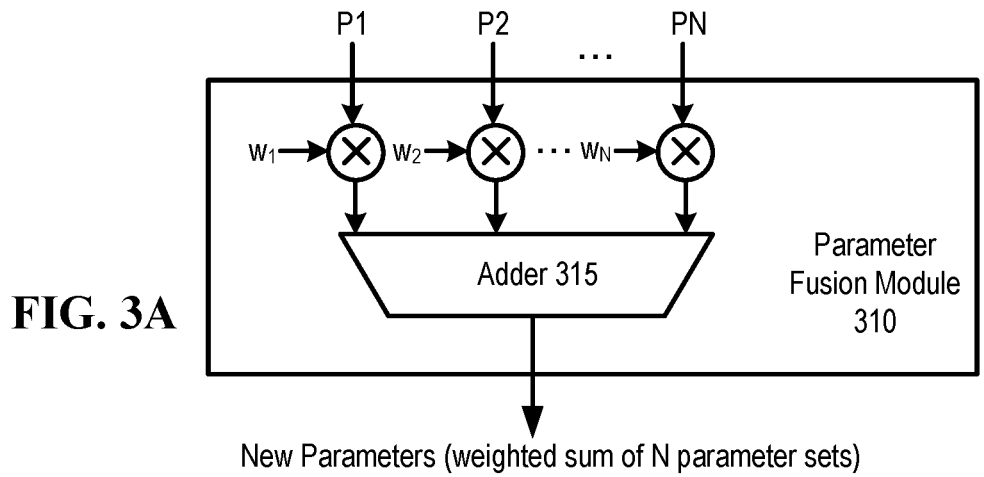
FIG. 3A illustrates a parameter fusion module according to one embodiment.

FIG. 3A illustrates a parameter fusion module 310 according to one embodiment. The parameter fusion module 310 may be an example of the parameter fusion module 220 in FIG. 2. In this example, the parameter fusion module 310 includes N multipliers to multiply the weights $w_1$, $w_2$, $w_3$, ... $w_N$ with their corresponding parameter sets. Some of the weights may be zero, and the total sum of the weights is equal to one. The parameter fusion module 310 further includes an adder 315 to compute a weighted sum of the parameter sets as output.

Figure 3B:
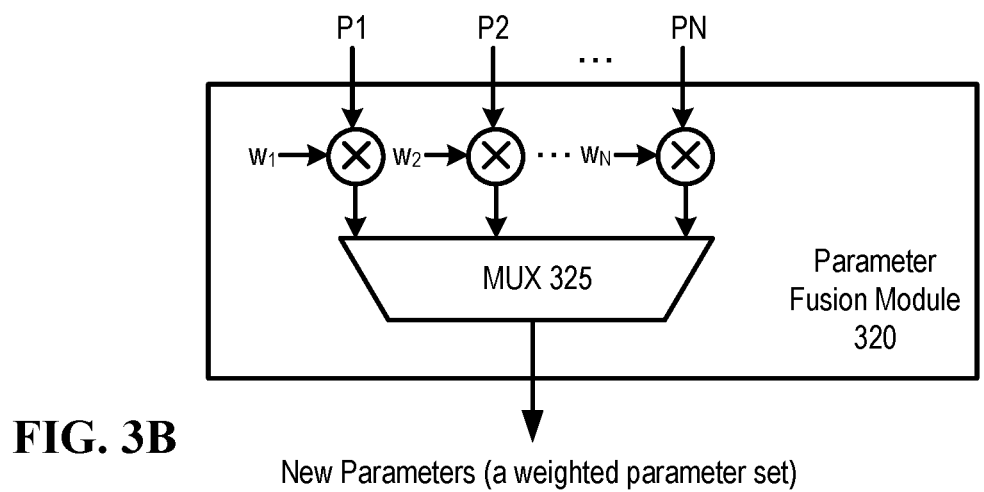
FIG. 3B illustrates a parameter fusion module according to another embodiment.

FIG. 3B illustrates a parameter fusion module 320 according to another embodiment. The parameter fusion module 320 may be an example of the parameter fusion module 220 in FIG. 2. In this example, the parameter fusion module 320 includes N multipliers to multiply the weights $w_1$, $w_2$, $w_3$, ... $w_N$ with their corresponding parameter sets. Some of the weights may be zero, and the total sum of the weights is equal to one. The parameter fusion module 320 further includes a multiplexer 325 to select a weighted parameter set as output. In one embodiment, only one of the weights (e.g., $w_1$) is equal to one and all the others are zero. Thus, the multiplexer 325 selects the parameter set corresponding to weight $w_1$ as output. The selected parameter set is used by the SR engine 140 for performing AI-based SR operations.

Figure 3C:
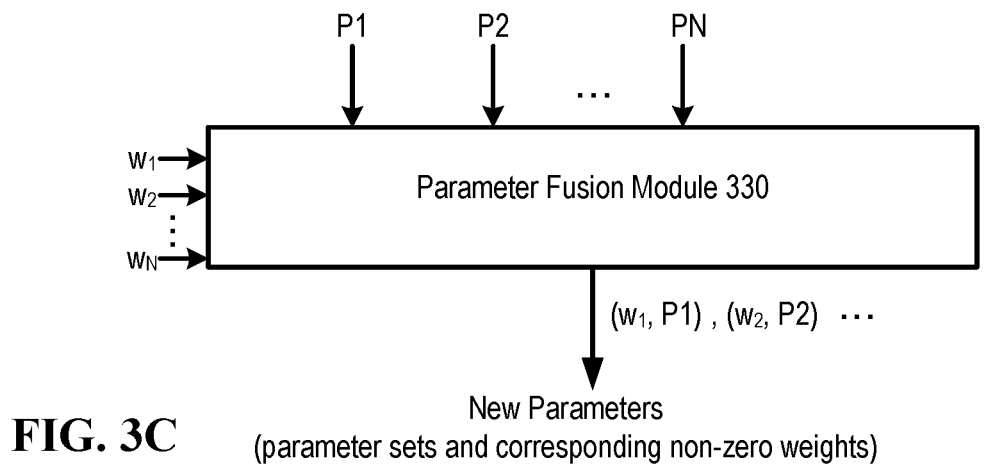
FIG. 3C illustrates a parameter fusion module according to yet another embodiment.

FIG. 3C illustrates a parameter fusion module 330 according to yet another embodiment. The parameter fusion module 330 may be an example of the parameter fusion module 220 in FIG. 2. In this example, the parameter fusion module 330 pairs the weights $w_1$, $w_2$, $w_3$, ... $w_N$ with their corresponding parameter sets. Some of the weights may be zero, and the total sum of the weights is equal to one. The parameter fusion module 330 may output the (non-zero weight, parameter set) pairs to the SR engine 140 for further processing. This embodiment allows the SR engine 140 to perform weighted AI operations to be described in connection with FIG. 5.

Depending on the contents and quality of the input image sequence, the parameter fusion module 220 in FIG. 2 may implement any of the fusion operations shown in FIGS. 3A, 3B, and 3C. Thus, in one embodiment, the parameter fusion module 220 may include a combination of the circuitry shown in FIGS. 3A, 3B, and 3C to implement various selection and fusion operations.

Figure 4:
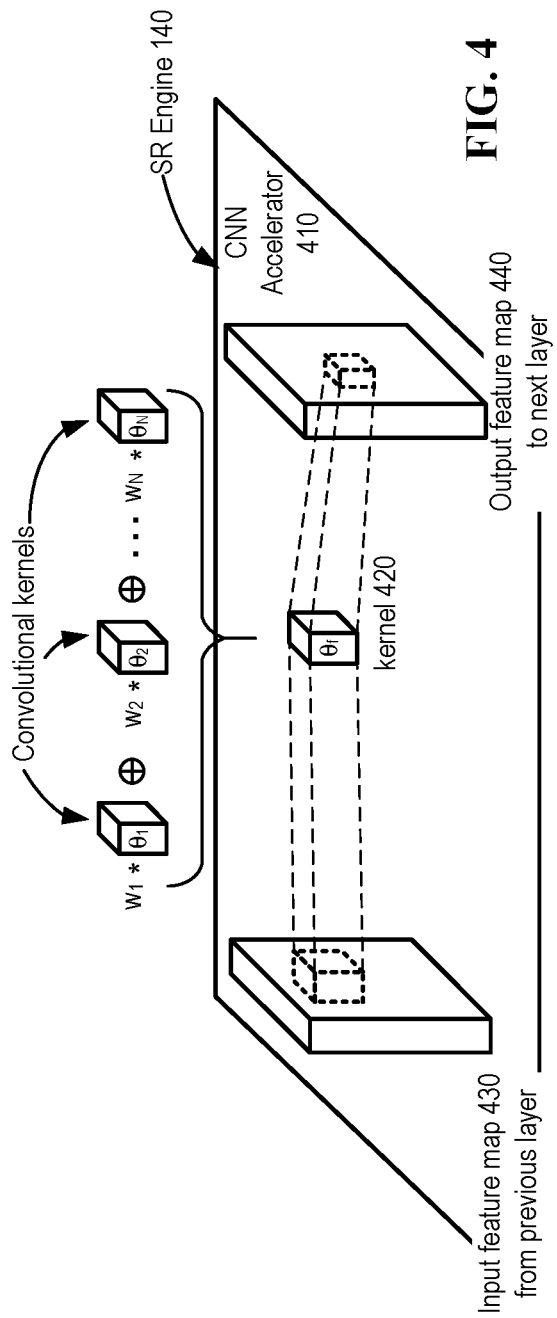
FIG. 4 illustrates an example of SR operations performed by an SR engine according to one embodiment.

FIG. 4 illustrates an example of SR operations performed by the SR engine 140 according to one embodiment. In this example, the SR engine 140 includes a CNN accelerator 410 to perform CNN operations on input frames.

In one embodiment, the CNN accelerator 410 includes hardware components specialized for accelerating neural network operations by convolutional operations, fully-connected operations, activation, pooling, normalization, element-wise mathematical computations, etc. In some embodiments, the CNN accelerator 410 includes multiple compute units and memory (e.g., Static Random Access Memory (SRAM)), where each compute unit further includes multipliers and adder circuits, among others, for performing mathematical operations such as multiply-and-accumulate (MAC) operations to accelerate the convolution, activation, pooling, normalization, and other neural network operations. The CNN accelerator 410 may perform fixed and floating-point neural network operations. The CNN accelerator 410 may perform the SR operations to generate high-resolution output frames with enhanced image quality.

The CNN accelerator 410 performs convolution operations by computing a convolution of an input feature map with a kernel. For example, an input feature map 430 from a previous layer of the CNN operations may be convolved with a kernel 420 to generate an output feature map 440 to the next layer. The kernel 420 contains a set of parameters; e.g., a set of 3×3 parameters. In one embodiment, the parameters in the kernel 420 are the new parameters (also referred to as the adjusted parameters) generated from the parameter decision module 130 in FIG. 1, or more specifically, from the parameter fusion module 220 in FIG. 2. In the example of FIG. 4, the parameter fusion module 220 computes a weighted sum of multiple parameter sets, as shown in the embodiment of FIG. 3A, where each of these parameter sets defines a different kernel. In this example, the kernel 420 ($\theta_f$)=$w_1\theta_1+w_2\theta_2+\ldots+w_N\theta_N$. The kernel 420 is passed from the parameter fusion module 220 to the SR engine 140 for performing CNN operations.

Figure 5:
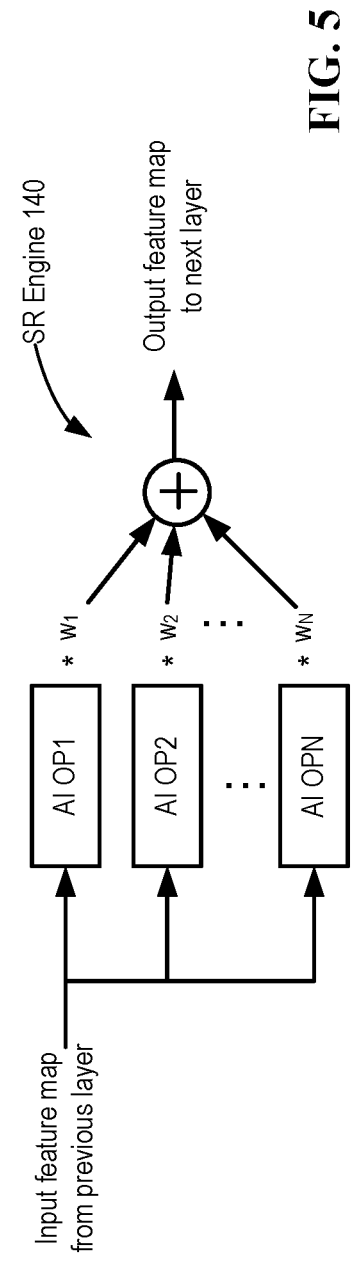
FIG. 5 illustrates an example of SR operations performed by an SR engine according to another embodiment.

FIG. 5 illustrates an example of SR operations performed by the SR engine 140 according to another embodiment. In this example, the SR engine 140 computes a weighted sum of AI operations (AI_OP1, AI_OP2, . . . ), such as CNN operations or other deep learning or machine learning operations. In one embodiment, the SR engine 140 receives the (non-zero weight, parameter set) pairs from the parameter fusion module 330 in FIG. 3C. Each AI_OP is executed using one of the parameter sets. The output of each AI_OP is multiplied by a corresponding weight. The weighted sum may be sent to the next layer of AI processing.

Figure 6:
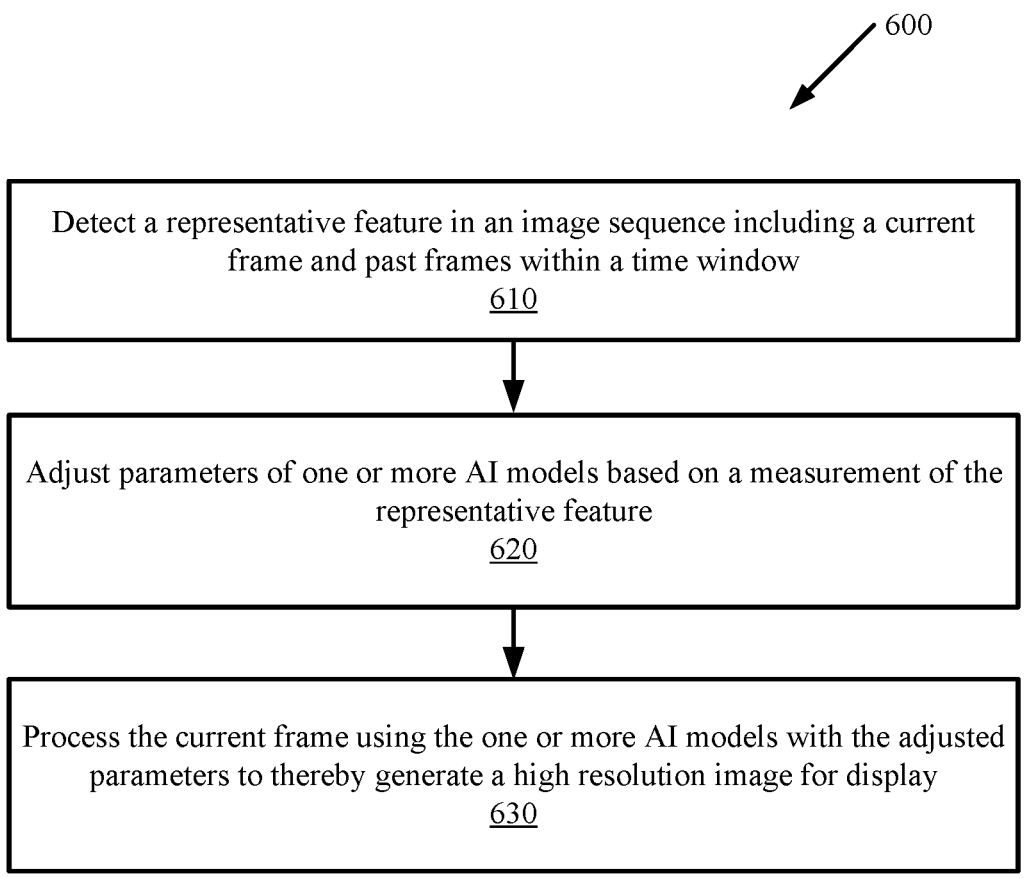
FIG. 6 is a flow diagram illustrating a method for SR operations according to one embodiment.

FIG. 6 is a flow diagram illustrating a method 600 for performing SR operations according to one embodiment. For example, the method 600 may be performed by the image processing circuit 200 in FIG. 2, a device 700 to be described in FIG. 7, and/or any of the embodiments described in connection with FIGS. 1, 3A, 3B and 3C. It is understood that the embodiments are for illustrative purposes only; other devices with image processing capabilities may perform the method 600.

The method 600 begins at step 610 when a device detects a representative feature in an image sequence including a current frame and past frames within a time window. The device at step 620 adjusts parameters of one or more AI models based on a measurement of the representative feature. The device at step 630 processes the current frame using the one or more AI models with the adjusted parameters to thereby generate a high-resolution image for display.

To adjust the parameters, the device may generate weights for two or more pre-trained parameter sets of the AI models based on the measurement of the representative feature, and applies the weights to the two or more pre-trained parameter sets to thereby generate the adjusted parameters. In some embodiments, the device may calculate a weighted sum from the weights and the two or more pre-trained parameter sets to generate the adjusted parameters. In some embodiments, the device may compute a weighted sum of kernels of a CNN to obtain a new kernel for processing the current frame.

Figure 7:
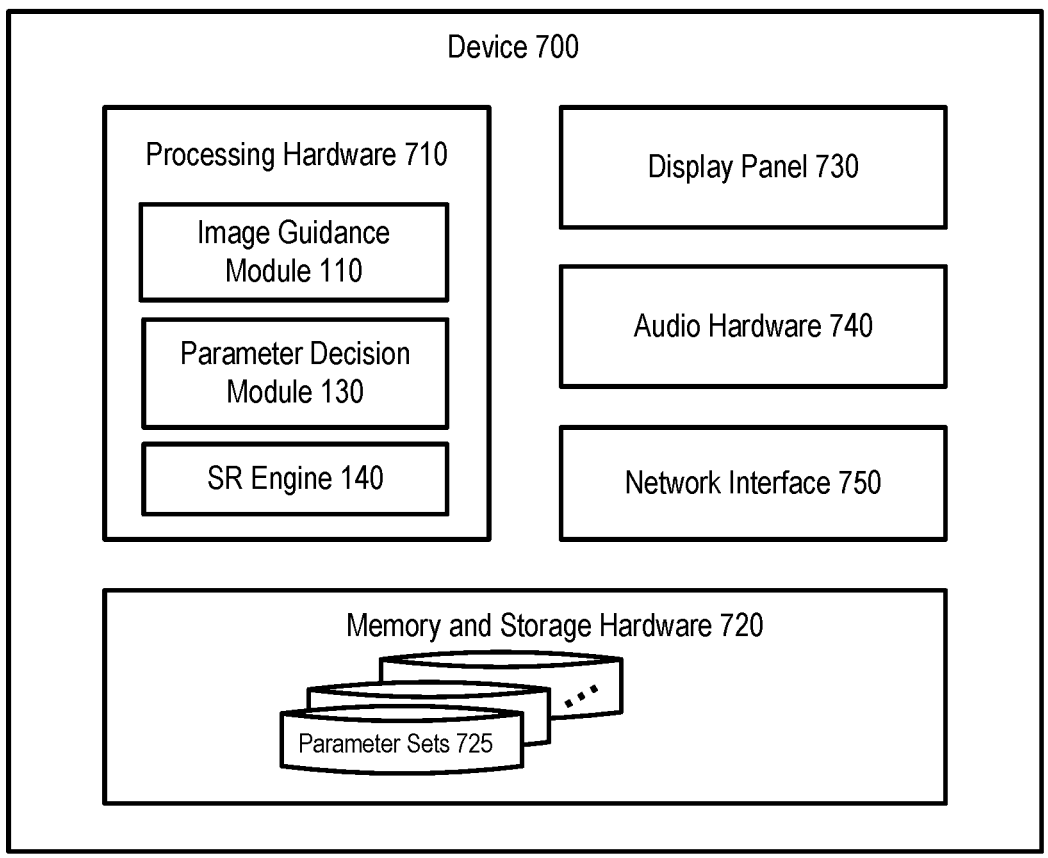
FIG. 7 illustrates an example of a device according to one embodiment.

FIG. 7 illustrates an example of a device 700 according to one embodiment. The device 700 may include the image processing circuit 200 of FIG. 2, which performs the aforementioned image enhancement operations including the SR operations. One example of the device 700 is a television, which receives a video with low resolution (e.g., 720×480 pixels) and performs SR operations to scale up the video to high resolution (e.g., 3840×2160 pixels) for display on the television screen. Alternatively, the device 700 may be a smartphone, a computing device, a network-connected device, a gaming device, an entertainment device, an Internet-of-things (IoT) device, or any device capable of processing and displaying images and/or videos.

The device 700 includes processing hardware 710. In one embodiment, the processing hardware 710 may include one or more processors, such as one or more of: a central processing unit (CPU), a GPU, a digital processing unit (DSP), an AI processor, a multimedia processor, other general-purpose and/or special-purpose processing circuitry. In one embodiment, the processing hardware 710 may include a hardware accelerator, such as a CNN accelerator. In one embodiment, the processing hardware 710 includes the image guidance module 110, the parameter decision module 130, and the SR engine 140 in the aforementioned embodiments.

The device 700 further includes a memory and storage hardware 720 coupled to the processing hardware 710. The memory and storage hardware 720 may include memory devices such as dynamic random access memory (DRAM), SRAM, flash memory, and other non-transitory machine-readable storage media; e.g., volatile or non-volatile memory devices. The memory and storage hardware 720 may further include storage devices, for example, any type of solid-state or magnetic storage device. In one embodiment, the memory and storage hardware 720 may store pre-trained parameter sets 725 as described in connection with FIG. 1 and FIG. 2. In some embodiments, the memory and storage hardware 720 may store instructions which, when executed by the processing hardware 710, cause the processing hardware 710 to perform the aforementioned operations for generating high-resolution images, such as the method 600 of FIG. 6.

The device 700 may also include a display panel 730 to display information such as images, videos, messages, Web pages, games, texts, and other types of text, image, and video data. The device 700 may also include audio hardware 740, such as a microphone and a speaker, for receiving and generating sounds.

In some embodiments, the device 700 may also include a network interface 750 to connect to a wired and/or wireless network for transmitting and/or receiving voice, digital data and/or media signals. It is understood the embodiment of FIG. 7 is simplified for illustration purposes. Additional hardware components may be included.

The operations of the flow diagram of FIG. 6 have been described with reference to the exemplary embodiments of FIG. 2 and FIG. 7. However, it should be understood that the operations of the flow diagram of FIG. 6 can be performed by embodiments of the invention other than the embodiments of FIG. 2 and FIG. 7, and the embodiments of FIG. 2 and FIG. 7 can perform operations different than those discussed with reference to the flow diagram. While the flow diagram of FIG. 6 shows a particular order of operations performed by certain embodiments of the invention, it should be understood that such order is exemplary (e.g., alternative embodiments may perform the operations in a different order, combine certain operations, overlap certain operations, etc.).

Various functional components or blocks have been described herein. As will be appreciated by persons skilled in the art, the functional blocks will preferably be implemented through circuits (either dedicated circuits, or general-purpose circuits, which operate under the control of one or more processors and coded instructions), which will typically comprise transistors that are configured in such a way as to control the operation of the circuitry in accordance with the functions and operations described herein. For example, the image guidance module 110, the parameter decision module 130, and the SR engine 140 of FIG. 1 may be functional blocks implemented through either dedicated circuits or general-purpose circuits.

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. An image processing circuit operative to perform super-resolution (SR) operations, comprising:
a memory to store a plurality of parameter sets of a plurality of artificial intelligence (AI) models that have been trained in an offline training phase;
an image guidance module to detect, using one or more of the AI models, a representative feature in an image sequence received during an online processing phase, the image sequence including a current frame and past frames within a time window;
a parameter decision module, which, during the online processing phase and based on the representative feature, is operative to generate N non-zero weights corresponding to N of the parameter sets, N being an integer greater than one, wherein the representative feature includes at least a scene type classification and an image quality measurement, and wherein in the offline training phase one of the N parameter sets is generated for the scene type classification and another of the N parameter sets is generated for the image quality measurement; and
an SR engine to execute a plurality of layers of AI operations on the current frame to thereby generate a high-resolution image for display, the SR engine operative to:
receive an input feature map at an intermediate layer of the plurality of layers from a previous layer,
perform N AI operations on the input feature map using respective ones of the N parameter sets to generate N outputs, and
compute a weighted sum of the N outputs using respective ones of the N non-zero weights to generate an output feature map to a next layer.

2. The image processing circuit of claim 1, wherein the parameter decision module is further operative to:
generate weights for two or more pre-trained parameter sets of the AI models based on the representative feature; and
apply the weights to the two or more pre-trained parameter sets to generate adjusted parameters.

3. The image processing circuit of claim 2, wherein the parameter decision module further comprises an adder operative to:
calculate a weighted sum from the weights and the two or more pre-trained parameter sets to generate the adjusted parameters.

4. The image processing circuit of claim 2, wherein the parameter decision module further comprises an adder operative to:
compute a weighted sum of kernels of a convolutional neural network (CNN) to obtain a new kernel for the SR engine to process the current frame.

5. The image processing circuit of claim 2, wherein the representative feature includes an image quality measurement q, and the two or more pre-trained parameter sets are pre-trained with images of image quality measurements q1 and q2, where $q1 < q < q2$.

6. The image processing circuit of claim 1, wherein the parameter decision module further includes a multiplexer operative to:
select a parameter set from a plurality of pre-trained parameter sets as a new parameter set based on the measurement of the representative feature; and
output the selected parameter set to the SR engine for processing the current frame.

7. The image processing circuit of claim 1, further comprising a CNN accelerator operative to perform CNN computations in the processing of the current frame.

8. The image processing circuit of claim 1, wherein the representative feature includes one or more of: an image quality index, a scene type, a degradation type, a degradation level, a color condition, image resolution, a noise level, a noise type, a video compression parameter, a coding artifacts level, color saturation, sharpness, and contrast.

9. The image processing circuit of claim 1, wherein the SR engine is further operative to:
remove artifacts in the current frame using the one or more AI models and the parameters adjusted based on a scene type and an image quality index measured from the image sequence.

10. A method for performing super-resolution (SR) operations, comprising:
receiving an image sequence including a current frame and past frames within a time window during an online processing phase;
detecting a representative feature in the image sequence using one or more of a plurality of artificial intelligence (AI) models that have been trained in an offline training phase, wherein the plurality of AI models are defined by a plurality of parameter sets;

generating, during the online processing phase and based on the representative feature, N non-zero weights corresponding to N of the parameter sets, N being an integer greater than one, wherein the representative feature includes at least a scene type classification and an image quality measurement, and wherein in the offline training phase one of the N parameter sets is generated for the scene type classification and another of the N parameter sets is generated for the image quality measurement; and executing a plurality of layers of AI operations on the current frame to thereby generate a high-resolution image for display, wherein executing the plurality of layers further comprises:
 receiving an input feature map at an intermediate layer of the plurality of layers from a previous layer,
 performing N AI operations on the input feature map using respective ones of the N parameter sets to generate N outputs, and
 computing a weighted sum of the N outputs using respective ones of the N non-zero weights to generate an output feature map to a next layer.

11. The method of claim 10, further comprising:
generating weights for two or more pre-trained parameter sets of the AI models based on the representative feature; and
applying the weights to the two or more pre-trained parameter sets to generate adjusted parameters.

12. The method of claim 11, wherein applying the weights further comprises:
calculating a weighted sum from the weights and the two or more pre-trained parameter sets to generate the adjusted parameters.

13. The method of claim 11, wherein applying the weights further comprises:
computing a weighted sum of kernels of a convolutional neural network (CNN) to obtain a new kernel for processing the current frame.

14. The method of claim 11, wherein the representative feature includes an image quality measurement q, and the two or more pre-trained parameter sets are pre-trained with images of image quality measurements q1 and q2, where $q1<q<q2$.

15. The method of claim 10, further comprising:
selecting a parameter set from a plurality of pre-trained parameter sets based on the measurement of the representative feature; and
processing the current frame using the one or more AI models with the selected parameter set.

16. The method of claim 10, wherein processing the current frame further comprises:
performing CNN computations to process the current frame.

17. The method of claim 10, wherein the representative feature includes one or more of: an image quality index, a scene type, a degradation type, a degradation level, a color condition, image resolution, a noise level, a noise type, a video compression parameter, a coding artifacts level, color saturation, sharpness, and contrast.

18. The method of claim 10, wherein processing the current frame further comprises:
removing artifacts in the current frame using the one or more AI models and the parameters adjusted based on a scene type and an image quality index measured from the image sequence.

* * * * *